(12) United States Patent
Sugimoto

(10) Patent No.: US 7,804,331 B2
(45) Date of Patent: Sep. 28, 2010

(54) SEMICONDUCTOR DEVICE

(75) Inventor: Hideki Sugimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/155,283

(22) Filed: Jun. 2, 2008

(65) Prior Publication Data

US 2008/0303551 A1 Dec. 11, 2008

(30) Foreign Application Priority Data

Jun. 5, 2007 (JP) ............................. 2007-149349

(51) Int. Cl.
*H03K 19/20* (2006.01)
*H03K 19/094* (2006.01)
(52) U.S. Cl. .................... 326/121; 326/33; 326/112; 326/119
(58) Field of Classification Search .............. 326/33, 326/95, 98, 112, 119, 121
See application file for complete search history.

(56) References Cited

U.S. PATENT DOCUMENTS 5,970,018 A * 10/1999 Iwata et al. ............. 365/230.06
6,756,814 B2 * 6/2004 Saitou et al. ................. 326/81
6,900,666 B2 * 5/2005 Kursun et al. ................ 326/95

FOREIGN PATENT DOCUMENTS

JP 05-022110 1/1993
JP 2003-224465 A 8/2003

* cited by examiner

*Primary Examiner*—Anh Q Tran
(74) *Attorney, Agent, or Firm*—Foley & Lardner LLP

(57) ABSTRACT

A semiconductor device according to an embodiment of the present invention includes an output stage circuit including a first conductive type first transistor and a second conductive type second transistor, the first conductive type first transistor being connected between a first power supply terminal and an output terminal, the second conductive type second transistor being connected between a second power supply terminal and the output terminal and having a leak current larger than that of the first transistor, and an input stage circuit outputting a logic value setting the first transistor to a non-conductive state and setting the second transistor to a conductive state in accordance with a logic circuit disable signal input when the output stage circuit is in a disable state.

8 Claims, 9 Drawing Sheets

SEMICONDUCTOR DEVICE

BACKGROUND OF THE INVENTION

1. Field of the Invention

The present invention relates to a logic circuit and a semiconductor integrated circuit including the logic circuit, and more particularly, to a semiconductor device adapted to a low-power operation.

2. Description of Related Art

Miniaturization of a manufacturing process of a semiconductor integrated circuit has recently been advancing. Therefore, withstand voltage of an MOS transistor forming the semiconductor integrated circuit such as CMOS LSI is decreased and operating voltage of the MOS transistor needs to be decreased. As the operating voltage decreases, operation speed of the MOS transistor is reduced. In order to prevent the operation speed from being reduced, threshold value voltage of the MOS transistor needs to be decreased.

However, when the threshold value voltage is decreased (for example about 0.4V or less), the transistor cannot be completely turned off, and subthreshold leak current flows between a drain and a source. This leak current causes a serious problem in the semiconductor integrated circuit such as LSI formed by a plurality of MOS transistors. This is because a pass-through current due to leak current of the transistor is generated even when the circuit in the semiconductor integrated circuit is logically in a disable state. There are caused significant problems such as increase of power consumption due to the pass-through current, increase of load to a power source, decrease of energy consumption efficiency, and increase of heat generation. These problems are obvious in the transistor of low-threshold voltage where high-speed operation is required. The leak current places severe limitation in realizing not only a circuit where low-power operation is required but also a circuit requiring high-speed operation. Further, the above-mentioned problems can further be serious since the subthreshold leak current exponentially increases in high-temperature operation of the semiconductor integrated circuit.

In order to overcome these problems, various techniques for reducing leak current in the semiconductor integrated circuit are suggested. One of the techniques is disclosed in Japanese Unexamined Patent Application Publication No. 2003-224465. In this Japanese Unexamined Patent Application Publication No. 2003-224465, a technique for intercepting leak current of the transistor having low-threshold voltage by the transistor having high-threshold voltage is disclosed.

Further, in Japanese Unexamined Patent Application Publication No. 5-22110, a technique for decreasing the pass-through current between an N-channel transistor and a P-channel transistor is disclosed.

According to the prior art as in Japanese Unexamined Patent Application Publication No. 2003-224465, the N-channel transistor or the P-channel transistor needs to be connected to ground or power source through the transistor having high-threshold voltage. This increases combined resistance when the transistor is turned on and increases output transition delay in normal operation, which reduces circuit operation speed.

Although the pass-through current in operation is decreased in the circuit configuration of the prior art such as Japanese Unexamined Patent Application Publication No. 5-22110, the leak current of the output transistor in an non-operating state is not considered.

Accordingly, it is desired to reduce the leak current without degrading circuit operation in the semiconductor integrated circuit such as CMOS LSI.

SUMMARY

A semiconductor device according to an aspect of the present invention includes an output stage circuit including a first conductive type first transistor and a second conductive type second transistor, the first conductive type first transistor being connected between a first power supply terminal and an output terminal, the second conductive type second transistor being connected between a second power supply terminal and the output terminal and having a leak current larger than that of the first transistor, and an input stage circuit outputting a logic value setting the first transistor to a non-conductive state and setting the second transistor to a conductive state in accordance with a logic circuit disable signal input when the output stage circuit is in a disable state.

According to the semiconductor device of the present invention, the output logic value of the input stage circuit is fixed according to the logic circuit disable signal which is input when the output stage circuit is in the disable state. Accordingly, the second conductive type second transistor of the output stage circuit having a high leak current is turned on, and the first conductive type first transistor is turned off, whereby the leak current in the semiconductor device can be reduced.

According to the present invention, it is possible to reduce the leak current in the semiconductor integrated circuit while minizing the effect of increase in on resistance of the transistor by the load circuit. Accordingly, power consumption can be reduced without reducing the circuit operation speed of the semiconductor integrated circuit.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

The specific embodiments to which the present invention is applied will be described hereinafter in detail with reference to the drawings. The first embodiment is the one where the present invention is applied to a semiconductor circuit of CMOS LSI.

Figure 1:
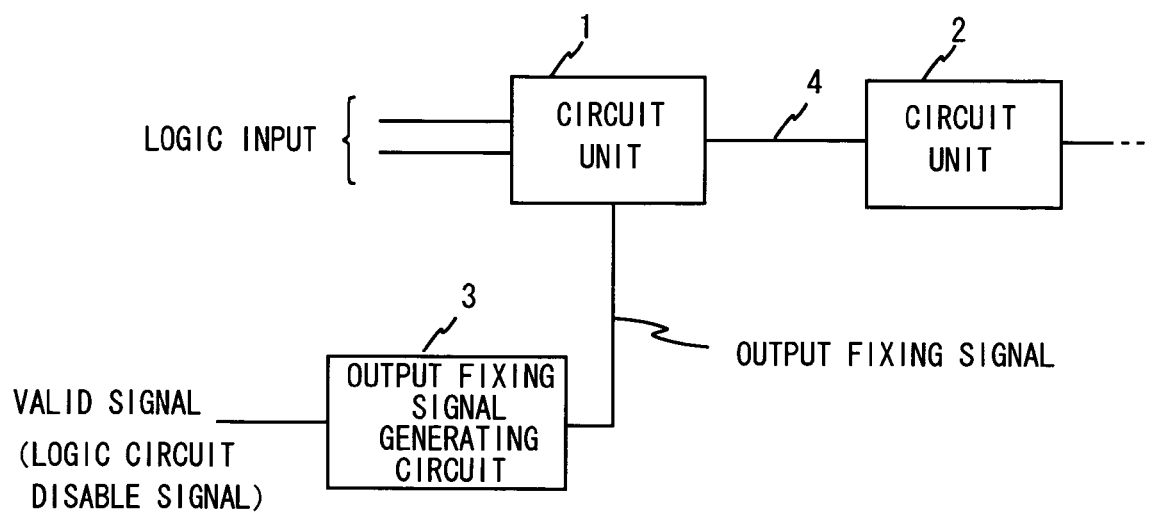
FIG. 1 is one example of a configuration of a semiconductor device according to a first embodiment.

FIG. 1 shows one example of a configuration block diagram of a semiconductor device according to the first embodiment. Note that only one stage in an instruction pipeline processing part in a CPU (Central Processing Unit) of a microcomputer is described in this example.

As shown in FIG. 1, the semiconductor device according to the first embodiment includes a circuit unit 1, a circuit unit 2, and an output fixing signal generating circuit 3 which sends an output fixing signal to the circuit unit 1. The circuit unit 1 and the circuit unit 2 are connected by a line 4. Although not specifically limited, the circuit unit 1 and the circuit unit 2 are formed by logic circuits or the like having a predetermined function. The line 4 has large output load. For example, the line 4 has large length of equal to or more than 200 μm. The output side line of the circuit unit 2 may also have large output load where the line is long and the fan out is large.

The output fixing signal generating circuit 3 generates the output fixing signal where a Valid signal is inverted. The Valid signal is a high level signal or a low-level signal which sets each computing unit of the instruction pipeline processing part (including stage processing part in the computing unit) of the CPU to an enable state or a disable state.

Figure 2:
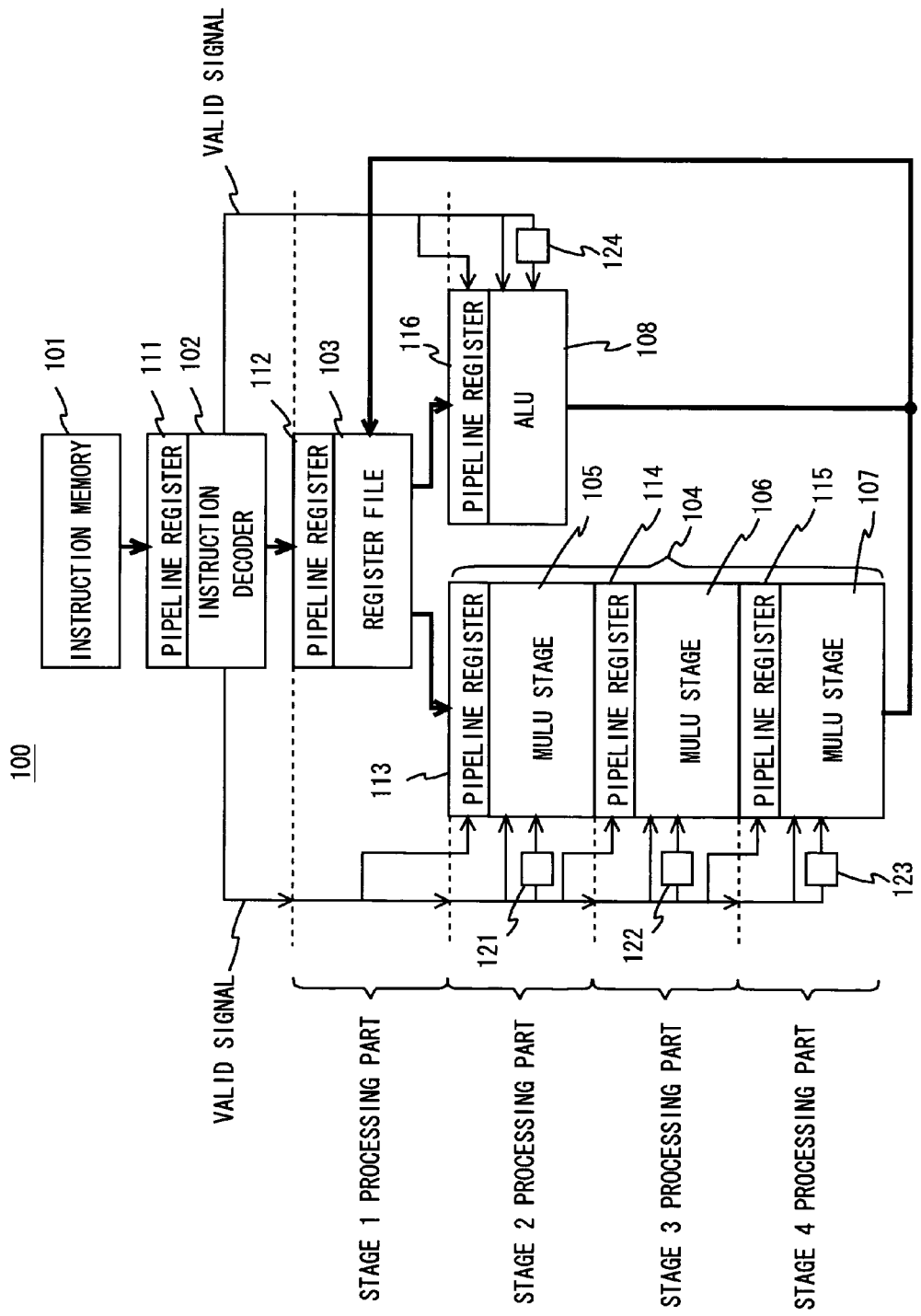
FIG. 2 is one example of a schematic view of an instruction pipeline processing part of the semiconductor device according to the first embodiment.

With reference to FIGS. 2 and 3, the output fixing signal output from the output fixing signal generating circuit 3 will be described. Assume here that each computing unit is in the enable state when the Valid signal which is the output of the instruction decoder is in the high level and each computing unit is in the disable state when the Valid signal is in a low level. Since the computing unit is in the disable state when the Valid signal is in the low level, the Valid signal is called logic circuit disable signal in a broad sense.

Although each computing unit is in the disable state when the Valid signal is in the low level in the first embodiment, each computing unit may be in the disable state when the Valid signal is in the high level. However, if each computing unit is set to be in the disable state when the Valid signal is in the high level, a circuit configuration of the pipeline register or the like needs to be changed so as to be able to control the enable state or the disable state of each computing unit in accordance with a logic state of the Valid signal. The configuration of the instruction pipeline processing part is not limited to the configuration in FIG. 2.

An instruction pipeline processing part 100 in FIG. 2 includes an instruction memory 101, an instruction decoder 102, a register file 103, an MULU (MULtiplay Unit) 104, an ALU (Arithmetic Logic Unit) 108, and output fixing signal generating circuits 121 to 124. The MULU 104 includes three stage processing parts and each of the three stage processing parts is called MULUs 105 to 107. Further, pipeline registers 111 to 116 are provided in each stage processing part of the pipeline. The output fixing signal generating circuits 121 to 124 output the output fixing signals to each of the computing units as the stage processing parts of the MULUs or the ALU. Note that each of the output fixing signal generating circuits 121 to 124 corresponds to the output fixing signal generating circuit 3 in FIG. 1, and each computing unit corresponds to the circuit unit 1 and the circuit unit 2 in FIG. 1.

Now, an example of a basic operation of the instruction pipeline processing part in FIG. 2 will be described. First, the instruction decoder 102 reads out an instruction from the instruction memory 101. When the instruction that is read out is the instruction employing the ALU 108 (mov or add in FIG. 3A), the instruction decoder 102 outputs the high-level Valid signal to the ALU. When the instruction that is read out is the instruction employing the MULU 104 (mul in FIG. 3A), then the instruction decoder 102 outputs the high level Valid signal to the MULU 104. At this time, the register file 103 reads out data if either one of the Valid signals is in the high level. The instruction decoder 102 typically outputs one clock high level Valid signal for each one instruction. When a plurality of clocks are needed for executing the instruction, the instruction decoder 102 outputs corresponding clocks of the high level Valid signals for each one instruction. As described above, the computing unit is in the enable state during a clock where the high-level Valid signal is input. In other words, the computing unit is in the disable state while the low level Valid signal is input.

Further, the Valid signals are transmitted with being shifted by one clock for each stage processing part. More specifically, we consider a case where the MULU is operated by the mul instruction. First, the mul instruction is read out to the instruction decoder 102 from the instruction memory 101, and then the instruction decoder 102 outputs the high level Valid signal to the MULU 104.

Since the Valid signal is in the high level, data of the register file 103 is read out in the stage 1 processing part in FIG. 2. At the same time, the pipeline register 113 of the MULU 104 is set to be the enable state by the high-level Valid signal of the stage 1 processing part.

After one clock cycle, the MULU 105 starts to operate in the stage 2 processing part after the high-level Valid signal is input, and the executing result is transmitted to the pipeline register 114. At the same time, the pipeline register 114 is set to be the enable state by the high-level Valid signal of the stage 2 processing part.

After one clock cycle, the MULU 106 starts to operate in the stage 3 processing part, and the executing result is transmitted to the pipeline register 115. At the same time, the pipeline register 115 is set to be the enable state by the high-level Valid signal of the stage 3 processing part.

After one clock cycle, the MULU 107 starts to operate in the stage 4 processing part, and the executing result is transmitted to the register file 103. Note that the output fixing signal generating circuits 121 to 123 each outputs the output fixing signal where the Valid signal is inverted to each computing unit in each of the stage 2, 3, and 4 processing parts.

Figure 3A:
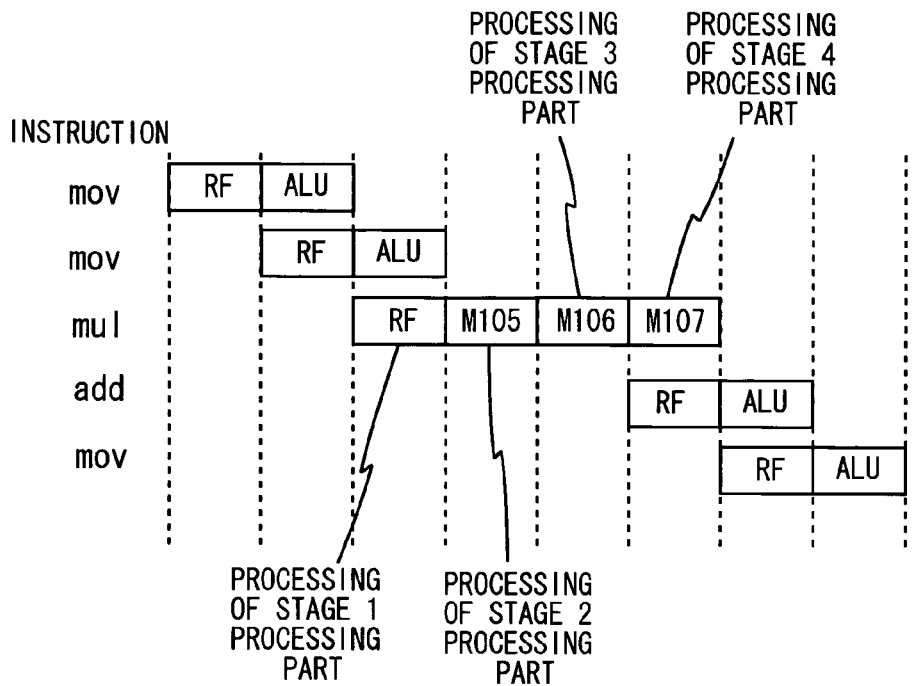
FIG. 3A is one example of a timing chart of a pipeline operation of each stage processing part of the semiconductor device according to the first embodiment.
Figure 3B:
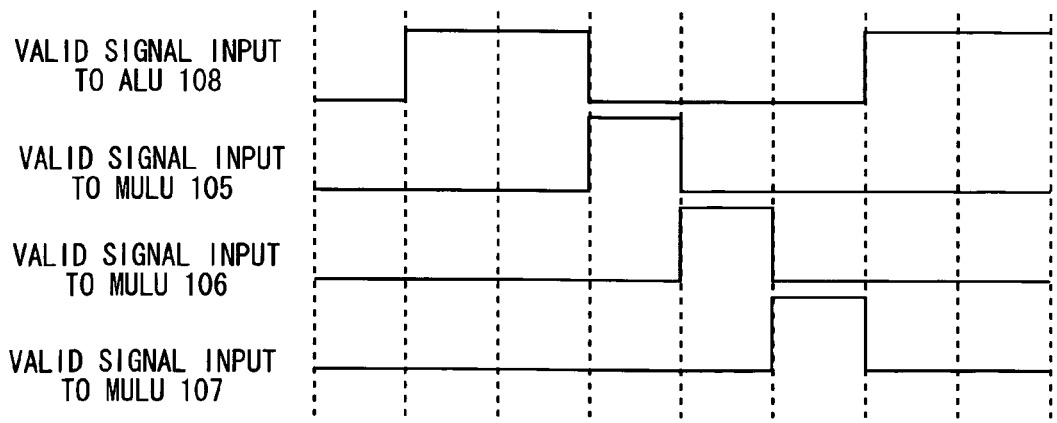
FIG. 3B is one example of a timing chart of Valid signals of each stage processing part of the semiconductor device according to the first embodiment.
Figure 3C:
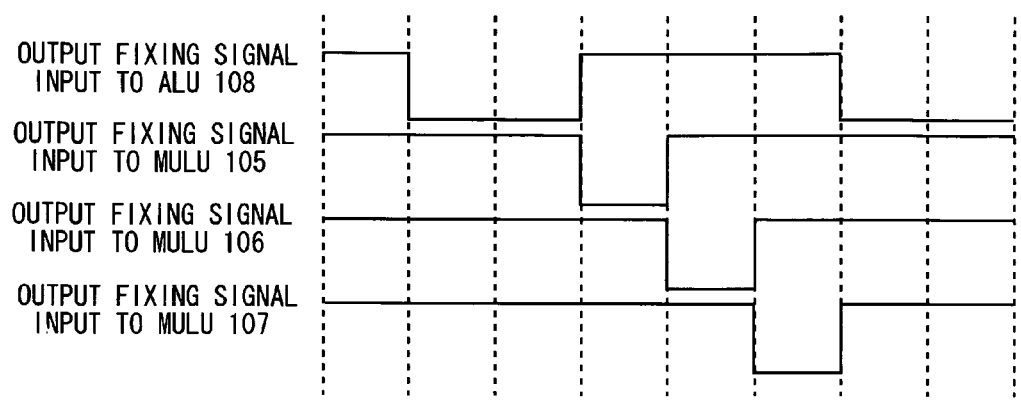
FIG. 3C is one example of a timing chart of output fixing signals of each stage processing part of the semiconductor device according to the first embodiment.

Now, a timing chart of the pipeline operation described above will be described with reference to FIGS. 3A to 3C. FIG. 3A shows an operation of each stage processing part of the MULU 104 and the ALU 108 in response to the instructions. FIG. 3B shows the Valid signals of each stage processing part which are input to the MULU 104 and the ALU 108. FIG. 3C shows the output fixing signals of each stage processing part which are input to the MULU 104 and the ALU 108. First, the ALU 108 will be described. In response to the mov or add instruction of FIG. 3A, the pipeline register 116 performs fetch (RF) of the register file 103 and the ALU 108 is operated at the next clock. Accordingly, the high-level Valid signal is input to the ALU 108 while the ALU 108 is operated, as shown in FIG. 3B. Hence, as shown in FIG. 3C, the low-level output fixing signal is input to the ALU 108 from the output fixing signal generating circuit 124 when the ALU 108 is in the enable state, and the high-level signal is input when the ALU 108 is in the disable state.

The same description can be applied to the MULU 104. In response to the mul instruction of FIG. 3A, the pipeline register 113 performs fetch (RF) of the register file 103, and the MULU 105 starts to operate in the next clock. In a further next clock, the MULU 106 starts to operate, and in a further next clock, the MULU 107 starts to operate. Accordingly, as shown in FIG. 3B, the high-level Valid signal is input when each of the MULUs 105 to 107 is in the enable state. Hence, as shown in FIG. 3C, the low-level output fixing signal is input to each of the MULUs 105 to 107 from the output fixing signal generating circuits 121 to 123 when each of the stage processing parts is in the enable state, and the high-level signal is input when each of the stage processing parts is in the disable state. The above description is about the output fixing signals output from the output fixing signal generating circuit 3, which corresponds to the output fixing signal generating circuits 121 to 124 in FIG. 2.

Now, an example of the detailed specific configuration of the semiconductor device of the present embodiment in FIG. 1 will be described with reference to FIG. 4. The same or similar components as those of FIG. 1 are denoted by like reference symbols.

Figure 4:
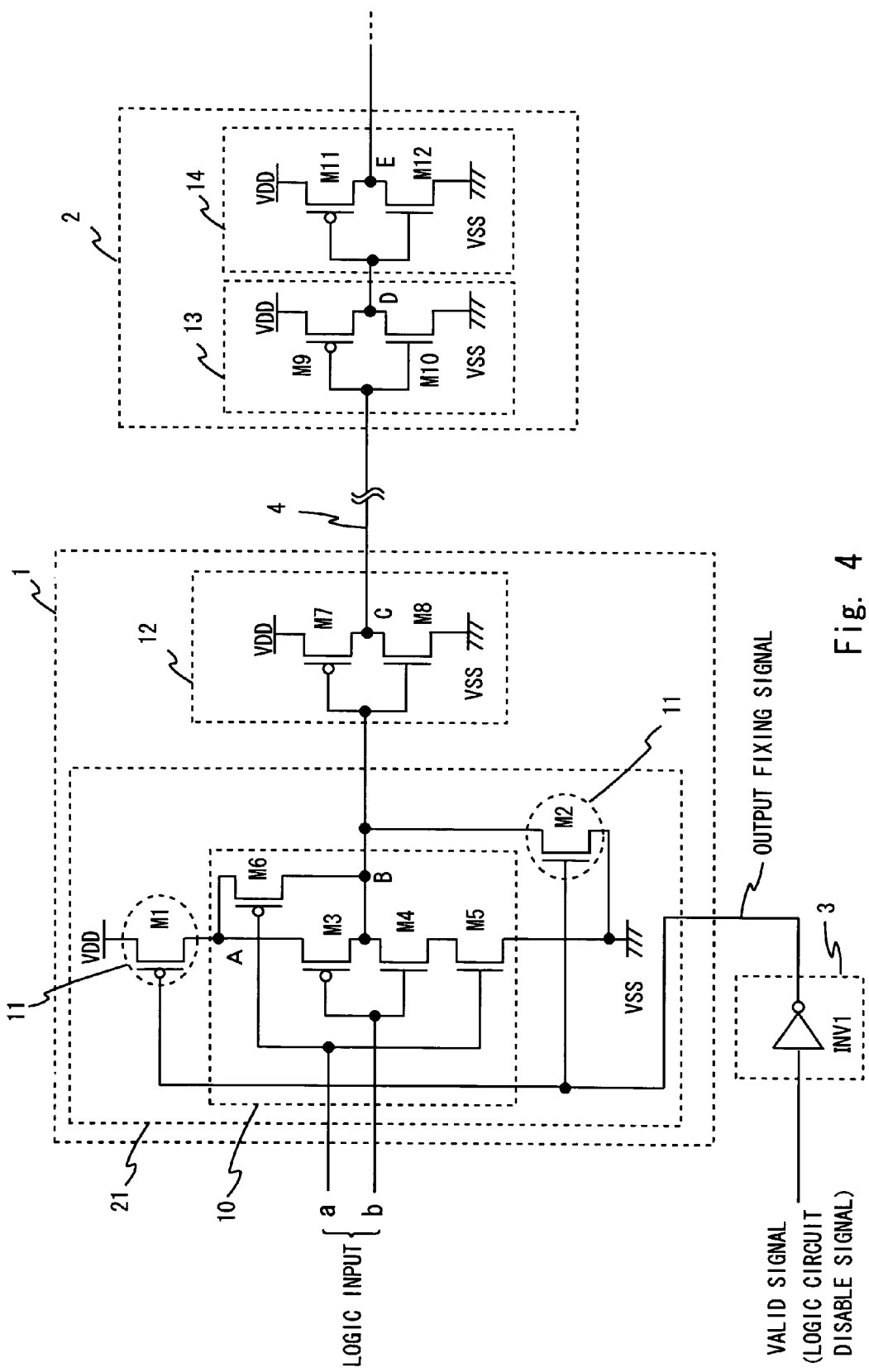
FIG. 4 is one example of a specific configuration of the semiconductor device according to the first embodiment.

As shown in FIG. 4, the circuit unit 1 includes an input stage circuit 21 and the output stage circuit 12.

The input stage circuit 21 includes a logic circuit 10 having a predetermined function although not specifically limited, and an output fixing circuit 11 connected to the logic circuit 10. The output stage circuit 12 is the logic circuit having a predetermined function although not specifically limited. The output fixing signal generating circuit 3 is formed by an inverter INV1, and therefore the output fixing signal generating circuit 3 inverts the input Valid signals to output the inverted signals to the output fixing circuit 11 as the output fixing signals.

The circuit unit 2 includes a logic circuit 13 having a predetermined function although not specifically limited, and a logic circuit 14 having a predetermined function although not specifically limited.

The logic circuit 10 has a configuration as follows in this example. A drain end of a p-channel MOS transistor M3 and a drain end of an n-channel MOS transistor M4 are connected in a node B. The p-channel MOS transistor M3 and the n-channel MOS transistor M4 have a gate input of a logic input b. Further, a source end of the p-channel MOS transistor M3 is connected to a node A. A source end of a p-channel MOS transistor M6 having a gate input of a logic input a is connected to the node A and a drain end thereof is connected to the node B. Similarly, a source end of an n-channel MOS transistor M5 having a gate input of the logic input a is connected to a low-potential side power supply VSS and a drain end thereof is connected to a source end of the n-channel MOS transistor M4.

The output fixing circuit 11 includes a p-channel MOS transistor M1 and an n-channel MOS transistor M2 having a gate input of the output fixing signal output from the output fixing signal generating circuit 3 in this example. A source end of the p-channel MOS transistor M1 is connected to a high-potential side power supply VDD, and a drain end thereof is connected to the node A. A source end of the n-channel MOS transistor M2 is connected to a low-potential side power supply VSS and a drain end thereof is connected to the node B.

The output stage circuit 12 has a following configuration in this example. A drain end of a p-channel MOS transistor M7 and a drain end of an n-channel MOS transistor M8 are connected in a node C. The p-channel MOS transistor M7 and the n-channel MOS transistor M8 have a gate input of a logic level of the node B. A source end of the p-channel MOS transistor M7 is connected to the high-potential side power supply VDD, and a source end of the n-channel MOS transistor M8 is connected to the low-potential side power supply VSS. The p-channel MOS transistor M7 has larger leak current in off time than the n-channel MOS transistor M8 does (more than twice larger, for example). As an example of the transistor generating a high leak current, it is assumed that the gate length (L) is relatively short, the gate width (W) is relatively large, the threshold voltage is relatively low, or the like. Some processes may have a transistor generating the high leak current only in the p-channel or the n-channel as in the present embodiment.

In the present embodiment, as an example of the circuit configuration, the output stage circuit 12 forms the inverter (output buffer) by the p-channel MOS transistor M7 and the n-channel MOS transistor M8. Generally, a large transistor is employed in the buffer in the circuit output stage. Therefore, as described above, the transistor forming the output stage circuit 12 is more likely to have the high leak current. In the present embodiment, it is assumed that the transistor forming the input stage circuit 21 is smaller than the transistor forming the output stage circuit 12 and the leak current flowing in the input stage circuit 21 is smaller than the leak current of the p-channel MOS transistor M7 of the output stage circuit 12. Further, the relation between the input stage circuit and the output stage circuit can be applied to the logic circuit 13 and the logic circuit 14 of the circuit unit 2 shown below.

The logic circuit 13 has a following configuration. A drain end of a p-channel MOS transistor M9 and a drain end of an n-channel MOS transistor M10 are connected in a node D. The p-channel MOS transistor M9 and the n-channel MOS transistor M10 have a gate input of a logic level of the node C. Further, a source end of the p-channel MOS transistor M9 is connected to the high-potential side power supply, and a source end of the n-channel MOS transistor M10 is connected to the low-potential side power supply VSS.

The logic circuit 14 has a following configuration. A drain end of a p-channel MOS transistor M11 and a drain end of an n-channel MOS transistor M12 are connected in a node E. The p-channel MOS transistor M11 and the n-channel MOS transistor M12 have a gate input of a logic level of a node D. Further, a source end of the p-channel MOS transistor M11 is connected to the high-potential side power supply, and a source end of the n-channel MOS transistor M12 is connected to the low-potential side power supply VSS. The P-channel MOS transistor M11 has a larger leak current in off time (more than twice larger, for example) than the n-channel MOS transistor M12 does, as is the same as the output stage circuit 12.

Now, an operation of the semiconductor device according to the present embodiment will be described. First, we consider a case where the computing units (circuit unit 1 and circuit unit 2) are in the enable state. In this case, the Valid signal is in the high level as described, and the output fixing signal output from the output fixing signal generating circuit 3 inverting the Valid signal is in the low level. Accordingly, the p-channel MOS transistor M1 forming the output fixing circuit 11 is in an on state, and the p-channel MOS transistor M1 connects the high-potential side power supply VDD and the node A which is the logic circuit 10. The n-channel MOS transistor M2 forming the output fixing circuit 11 is in an off state. Therefore, potential of the low-potential side power supply VSS is not supplied to the node B. Accordingly, the logic circuit 10 performs a normal operation for the logic inputs a and b, and outputs the calculation result to the output stage circuit 12. The logic circuit 13 of the circuit unit 2 also performs the normal operation where the output result of the logic circuit 12 is set to be the input, and the logic circuit 14 also performs the normal operation where the calculation result output from the logic circuit 13 is set to be input.

Now, we consider a case where the stage is in the disable state. In this case, as described above, the Valid signal is in the low level and the output fixing signal output from the output fixing signal generating circuit 3 inverting the Valid signal is in the high level. Accordingly, the p-channel MOS transistor M1 forming the output fixing circuit 11 is in the off state, and the high-potential side power supply VDD and the node A which is the logic circuit 10 are disconnected. The n-channel MOS transistor M2 forming the output fixing circuit 11 is in the on state, whereby potential of the low-potential side power supply VSS is supplied to the node B. Accordingly, the low level logic level is output to the node B.

Since the node B is in the low level, the p-channel MOS transistor M7 of the output stage circuit 12 is forced to be in the on state and the n-channel MOS transistor M8 is forced to be in the off state. Accordingly, the logic level in the node C is the high level which is the output result of the output stage circuit 12. The p-channel MOS transistor M7 generating the high leak current is forced to be in the on state, and the n-channel MOS transistor M8 having relatively smaller leak current is in the off state. From the above description, the pass-through current of the output circuit 12 flows only in the n-channel MOS transistor M8. Now we assume that the logic value input to the output stage circuit 12 is not controlled in the input stage circuit 21 as described above. In this case, when the n-channel MOS transistor M8 is turned on and the p-channel MOS transistor M7 is turned off, the pass-through current of the output stage circuit 12 becomes larger than the above case since the p-channel transistor M7 has the high leak current. Note that the logic value input to the output stage circuit 12 in which the p-channel MOS transistor M7 generating the high leak current is turned on and the n-channel MOS transistor M8 having relatively smaller leak current is turned off is generated by the input stage circuit 21 which is in the previous stage.

Since the node C is in the high level in the circuit unit 2, the p-channel MOS transistor M9 of the logic circuit 13 is in the off state and the n-channel MOS transistor M10 is in the on state. Accordingly, the low level which is the output result of the logic circuit 13 is output to the node D.

Since the node D is in the low level, the p-channel MOS transistor M11 of the logic circuit 14 is forced to be in the on state and the n-channel MOS transistor M12 is forced to be in the off state. The logic level in the node E is the high level which is the output result of the output stage circuit 14. Note that the p-channel MOS transistor M11 generating the high leak current is forced to be in the on state and the n-channel MOS transistor M12 having relatively smaller leak current is forced to be in the off state. From the above description, the pass-through current of the logic circuit 14 flows only in the n-channel MOS transistor M12.

The logic value input to the logic circuit 14 in which the p-channel MOS transistor M11 generating the high leak current is turned on and the n-channel MOS transistor M12 having relatively smaller leak current is turned off is generated by the previous logic circuit 13. At this time, the logic value output from the logic circuit 13 is determined by the logic value of the node C output according to the Valid signal as described above. In other words, the logic value output from the logic circuit 13 can also be regarded as being output according to the Valid signal. From the above description, the logic circuit 13 included in the circuit unit 2 can be regarded as the input stage circuit, and the logic circuit 14 can be regarded as the output stage circuit in a broad sense.

Note that only the circuit unit 1 and the circuit unit 2 are described in the present embodiment. However, when further circuit units are provided in the later stage, the circuit units have the same circuit configurations as those described above, thereby making it possible to reduce power consumption of the computing unit including those circuit units in the disable state.

From the above description, the p-channel MOS transistors M7 and M11 which are the transistors generating the high leak current can be forced to be held in the on state when each computing unit is in the disable state using control signals such as the Valid signal transmitted from the instruction decoder and switching each computing unit between the enable state and the disable state. Since the pass-through current flows only in the n-channel MOS transistor M8 and the n-channel MOS transistor M12 having relatively smaller leak current when each computing unit is in the disable state, the leak current of the computing unit including each circuit unit can be reduced. Further, it is possible to reduce the leak current of a whole semiconductor device including other computing units having the same configurations. The control of on or off of the transistor generating the high leak current is realized by using the enable signal (or disable signal) of the computing unit such as the Valid signal that is conventionally used without adding new signals.

At the same time, the output fixing circuit 11 for fixing the output of the input stage circuit 21 is connected to the logic circuit 10 having smaller leak current of the previous stage of the final stage instead of being connected to the final stages of each circuit unit such as the output stage circuit 12 or the logic circuit 14 including transistors generating the high leak current. Accordingly, the above operation is performed by the output fixing circuit 11 at the same time when the output fixing circuit 11 disconnects the power supply to the logic circuit 10 when the computing unit is in the disable state. Accordingly, the load can be relatively small compared with a case where power supply to the output stage circuit 12 and the logic circuit 14 which are the circuit output stage is directly disconnected, whereby it is possible to reduce the influence on the delay due to the increase in on resistance of the transistor which causes a problem in the prior art.

Figure 5:
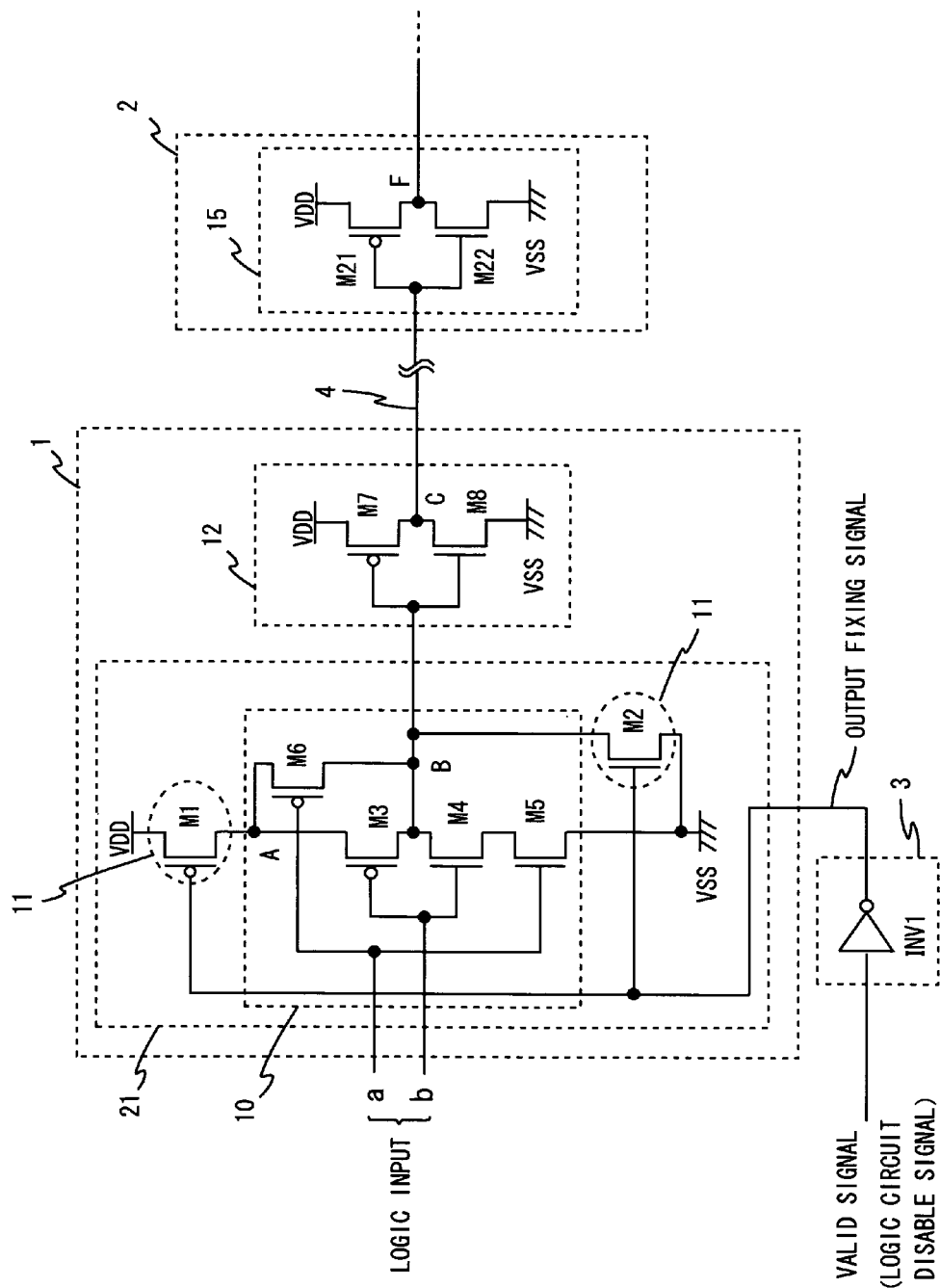
FIG. 5 is one example of a specific configuration of the semiconductor device according to the first embodiment.

FIG. 5 shows another example having a different configuration of the circuit unit 2 for the purpose of reference. A case is shown here where the n-channel MOS transistor M22 has the larger leak current in the off state in the logic circuit 15 than the p-channel MOS transistor M21 does. In this example, as in the same way as the operation in the example of FIG. 4 above, the n-channel MOS transistor M22 keeps the on state when the computing unit is in the disable state. Accordingly, the pass-through current flows only in the p-channel MOS transistor M21 having relatively small leak current. As stated, even when the configuration of the circuit unit 2 is changed, it is possible to reduce the leak current of the computing unit in the disable state as the configuration of the circuit FIG. 4.

Second Embodiment

Figure 6:
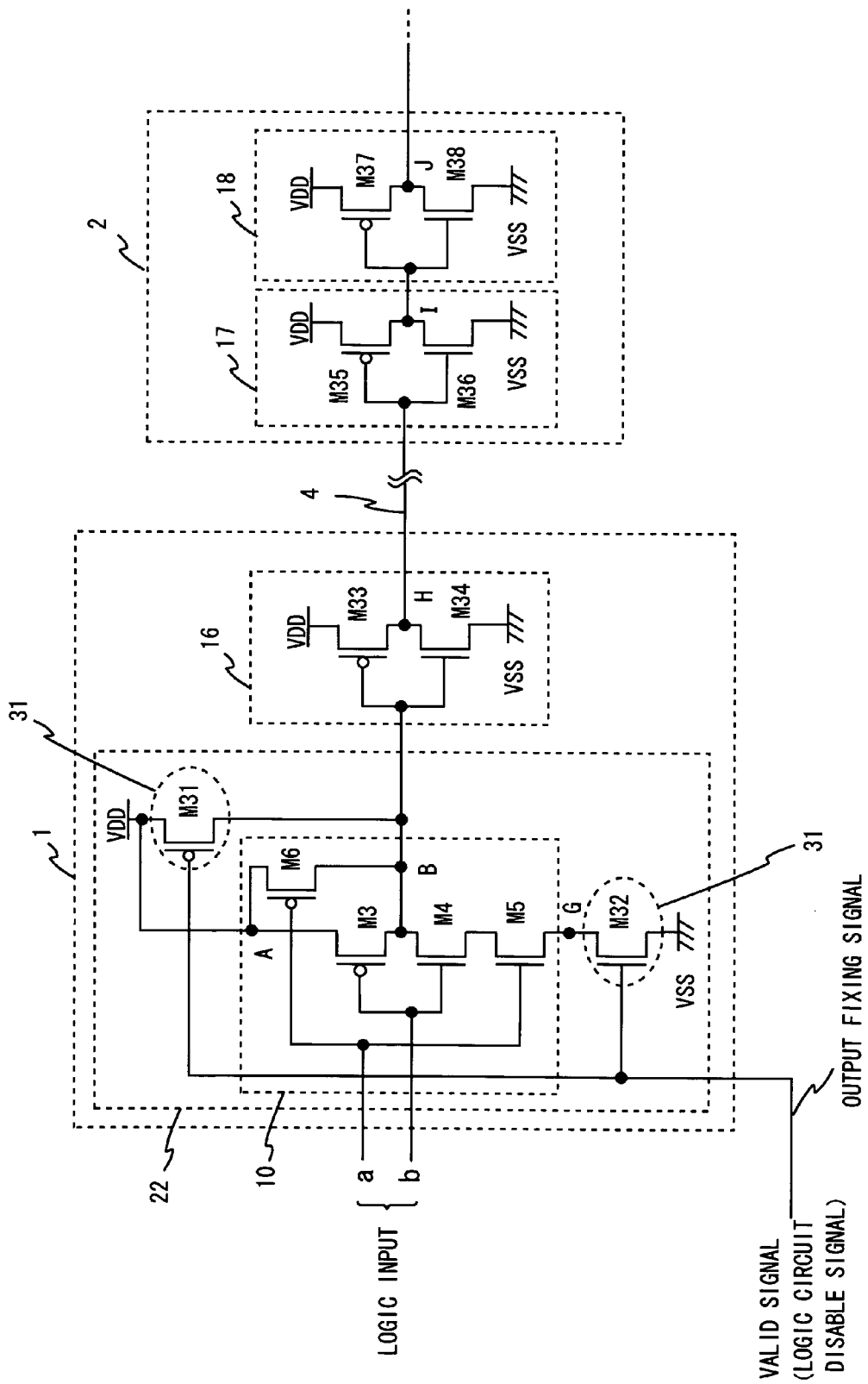
FIG. 6 is one example of a specific configuration of a semiconductor device according to a second embodiment.

Now, a semiconductor device according to the second embodiment of the present invention will be described. A specific configuration of the semiconductor device of the present embodiment shown in FIG. 1 will be described with reference to FIG. 6. FIG. 6 shows one example of a configuration of the semiconductor device according to the second embodiment. Note that the same or similar components as those of FIGS. 1 and 4 are denoted by like reference symbols.

The differences between the first embodiment and the second embodiment are the connection between the output fixing circuit 31 of the input stage circuit 22 and the logic circuit 10, and configurations of an output stage circuit 16 and the circuit unit 2. There is a transistor having the high leak current in the n-channel MOS transistor M34 of the output stage circuit 16. Further, there is a transistor having the high leak current in the n-channel MOS transistor M38 of the logic circuit 18 of the circuit unit 2. The configuration of the logic circuit 10 is the same as the configuration described in the first embodiment, and therefore the overlapping description will be omitted. However, the node A is connected to the high-potential side power supply VDD, and a source end of the n-channel MOS transistor M5 is connected to a node G. Note that the output fixing signal generating circuit 3 is omitted since the Valid signal can be directly employed as the output fixing signal in the present embodiment.

As shown in FIG. 6, the circuit unit 1 includes an input stage circuit 22 and the output stage circuit 16 in the present embodiment. The input stage circuit 22 includes a logic circuit 10 having a predetermined function although not specifically limited, and an output fixing circuit 31 connected to the logic circuit 10. The output stage circuit 16 is the logic circuit having a predetermined function although not specifically limited.

The circuit unit 2 includes a logic circuit 17 having a predetermined function although not specifically limited, and a logic circuit 18 having a predetermined function although not specifically limited.

The output fixing circuit 31 includes a p-channel MOS transistor M31 and an n-channel MOS transistor M32 having a gate input of the Valid signal as the output fixing signal. A source end of the p-channel MOS transistor M31 is connected to the high-potential side power supply VDD, and a drain end thereof is connected to the node B. A source end of the n-channel MOS transistor M32 is connected to the low-potential side power supply VSS and a drain end thereof is connected to the node G.

The output stage circuit 16 has a following configuration. A drain end of a p-channel MOS transistor M33 and a drain end of an n-channel MOS transistor M34 are connected in a node H. The p-channel MOS transistor M33 and the n-channel MOS transistor M34 have a gate input of a logic level of the node B. A source end of the p-channel MOS transistor M33 is connected to the high-potential side power supply VDD, and a source end of the n-channel MOS transistor M34 is connected to the low-potential side power supply VSS. The n-channel MOS transistor M34 has larger leak current in off time than the p-channel MOS transistor M33 does (more than twice larger, for example).

The logic circuit 17 has a following configuration. A drain end of a p-channel MOS transistor M35 and a drain end of an n-channel MOS transistor M36 are connected in a node I. The p-channel MOS transistor M35 and the n-channel MOS transistor M36 have a gate input of a logic level of the node H. Further, a source end of the p-channel MOS transistor M35 is connected to the high-potential side power supply VDD, and a source end of the n-channel MOS transistor M36 is connected to the low-potential side power supply VSS.

The logic circuit 18 has a following configuration. A drain end of a p-channel MOS transistor M37 and a drain end of an n-channel MOS transistor M38 are connected in a node J. The p-channel MOS transistor M37 and the n-channel MOS transistor M38 have a gate input of a logic level of a node I. Further, a source end of the p-channel MOS transistor M37 is connected to the high-potential side power supply VDD, and a source end of the n-channel MOS transistor M38 is connected to the low-potential side power supply VSS. The n-channel MOS transistor M38 has a larger leak current in off time (more than twice larger, for example) than the p-channel MOS transistor M37 does.

Now, an operation of the semiconductor device according to the present embodiment will be described. First, we consider a case where the computing units (circuit unit 1 and circuit unit 2) are in the enable state. In this case, the Valid signal input to the computing unit is in the high level as described. Since the Valid signal is directly used as the output fixing signal, the n-channel MOS transistor M32 forming the output fixing circuit 31 is in the on state to connect the low-potential side power supply VSS and the node G which is the logic circuit 10. Further, since the p-channel MOS transistor M31 forming the output fixing circuit 31 is in the off state, potential of the high-potential side power supply VDD is not supplied to the node B. Accordingly, the logic circuit 10 performs a normal operation for the logic inputs a and b, and outputs the calculation result to the output stage circuit 16. The output stage circuit 16 performs the normal operation where the output result of the logic circuit 10 is set to be input. In the following operation, the logic circuit 17 of the circuit unit 2 performs the normal operation where the output result of the output stage circuit 16 is set to be input, and the logic circuit 18 also performs the normal operation where the output result of the logic circuit 17 is set to be input.

Now, we consider a case where the stage is in the disable state. In this case, as described above, the Valid signal is in the low level and the output fixing signal directly using the Valid signal is in the low level as well. Accordingly, the n-channel MOS transistor M32 forming the output fixing circuit 31 is in the off state, and the low-potential side power supply VSS and the node G or the logic circuit 10 are disconnected. The p-channel MOS transistor M31 forming the output fixing circuit 31 is in the on state, whereby potential of the high-potential side power supply VDD is supplied to the node B. Accordingly, the high level logic level is output to the node B.

Since the node B is in the high level, the p-channel MOS transistor M33 of the output stage circuit 16 is forced to be in the off state and the n-channel MOS transistor M34 is forced to be in the on state. Accordingly, the logic level in the node H is the low level which is the output result of the output stage circuit 16. The n-channel MOS transistor M34 generating the high leak current is forced to be in the on state, and the n-channel MOS transistor M33 having relatively smaller leak current is in the off state. From the above description, the pass-through current of the output stage circuit 16 flows only in the p-channel MOS transistor M33. Now we assume that the logic value input to the output stage circuit 16 is not controlled in the input stage circuit 22 as described above. In this case, when the p-channel MOS transistor M33 is turned on and the n-channel MOS transistor M34 is turned off, the pass-through current of the output stage circuit 16 becomes larger than the above case since the n-channel transistor M34 has the high leak current.

Since the node H is in the low level in the circuit unit 2, the p-channel MOS transistor M35 of the logic circuit 17 of the circuit unit 2 is in the on state and the n-channel MOS transistor M36 is in the off state. Accordingly, the high level which is the output result of the logic circuit 17 is output to the node I.

Since the node I is in the high level, the p-channel MOS transistor M37 of the logic circuit 18 is forced to be in the off state and the n-channel MOS transistor M38 is forced to be in the on state. The logic level in the node J is the low level which is the output result of the output stage circuit 18. Note that the n-channel MOS transistor M38 generating the high leak current is forced to be in the on state and the p-channel MOS transistor M37 having relatively smaller leak current is forced to be in the off state. From the above description, the pass-through current of the logic circuit 18 flows only in the p-channel MOS transistor M37.

The logic value input to the logic circuit 18 in which the n-channel MOS transistor M38 generating the high leak current is turned on and the p-channel MOS transistor M37 having relatively smaller leak current is turned off is generated by the previous logic circuit 17. At this time, the logic value output from the logic circuit 17 is determined by the logic value of the node H output according to the Valid signal as described above. In other words, the logic value output from the logic circuit 17 can also be regarded as being output according to the Valid signal. From the above description, the logic circuit 17 included in the circuit unit 2 can be regarded as the input stage circuit, and the logic circuit 18 can be regarded as the output stage circuit in a broad sense.

Note that only the circuit unit 1 and the circuit unit 2 are described in the present embodiment. However, when further circuit units are provided in the later stage, the circuit units have the same circuit configurations as those described above, thereby making it possible to reduce power consumption of the computing unit including those circuit units in the disable state.

From the above description, the n-channel MOS transistors M34 and M38 which are the transistors generating the high leak current can forced to be held in the on state when each computing unit is in the disable state using control signals such as the Valid signal transmitted from the instruction decoder and switching each computing unit between the enable state and the disable state. Since the pass-through current flows only in the p-channel MOS transistor M33 and the p-channel MOS transistor M37 having relatively smaller leak current when each computing unit is in the disable state, the leak current of the computing unit including each circuit unit can be reduced. Further, it is possible to reduce the leak current of a whole semiconductor device including other computing units having the same configurations. The control of on or off of the transistor generating the high leak current is realized by using the enable signal of the computing unit such as the Valid signal that is conventionally used without adding new signals.

At the same time, the output fixing circuit 31 for fixing the output of the input stage circuit 22 is connected to the logic circuit 10 having smaller leak current of the previous stage of the final stage instead of being connected to the final stages of each circuit unit such as the output stage circuit 16 or the logic circuit 18 including transistors generating the high leak current. The above operation is performed by the output fixing circuit 31 at the same time when the output fixing circuit 31 disconnects the power supply to the logic circuit 10 when the computing unit is in the disable state. Accordingly, the load can be relatively small compared with a case where power supply to the output stage circuit 16 which is the circuit output stage and the logic circuit 18 is directly disconnected, whereby it is possible to reduce the influence on the delay due to the increase in on resistance of the transistor which causes a problem in the prior art.

Figure 7:
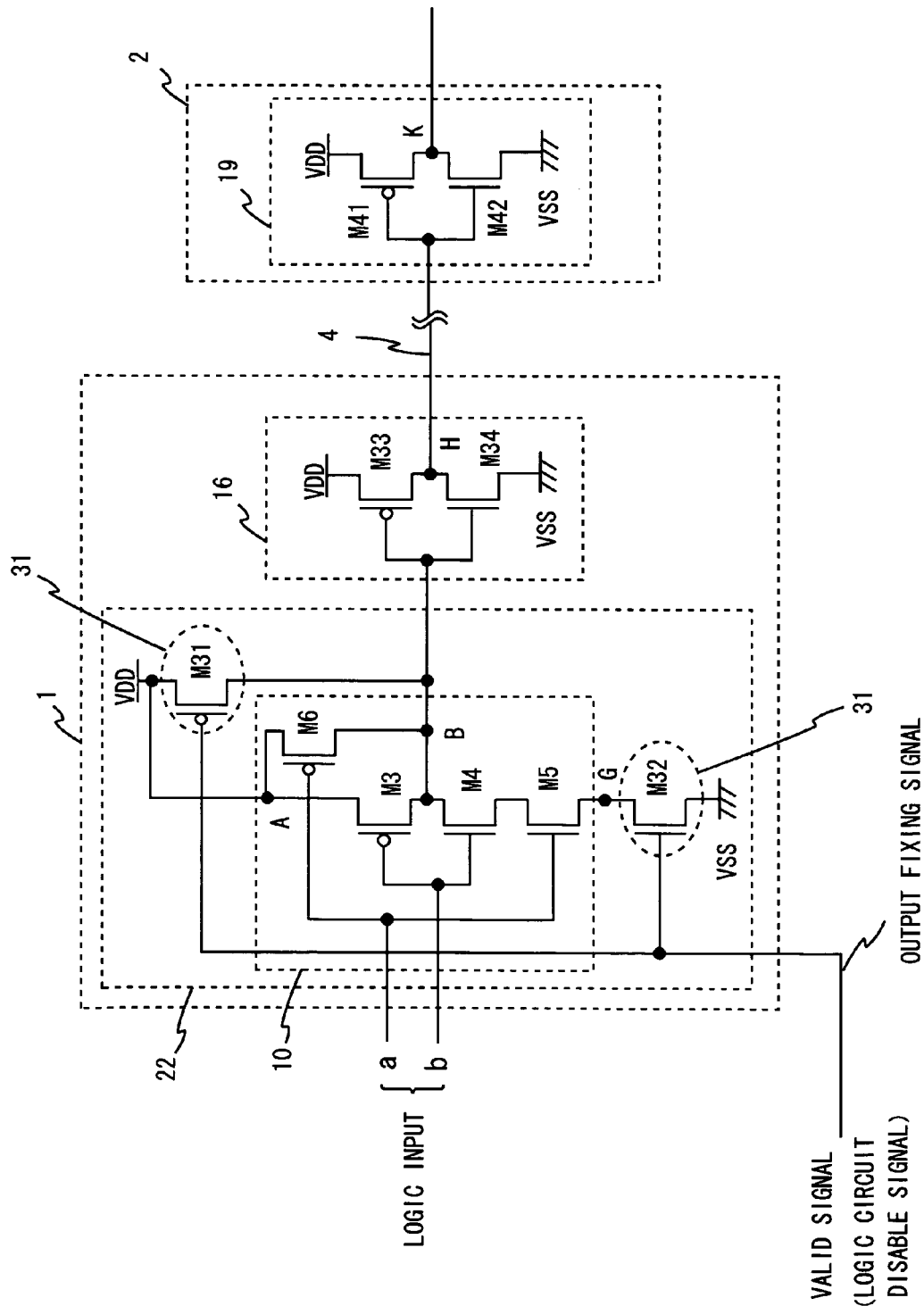
FIG. 7 is one example of a specific configuration of the semiconductor device according to the second embodiment.

FIG. 7 shows another example having a different configuration of the circuit unit 2 for the purpose of reference. A case is shown here where the p-channel MOS transistor M41 has the larger leak current in the off state in the logic circuit 19 than the n-channel MOS transistor M42 does. In this example, as in the same way as the operation of the example in FIG. 6 above, the p-channel MOS transistor M41 keeps the on state when the computing unit is in the disable state. Accordingly, the pass-through current flows only in the n-channel MOS transistor M42 having relatively small leak current. As stated, even when the configuration of the circuit unit 2 is changed, it is possible to reduce the leak current of the computing unit in the disable state as the configuration of the circuit FIG. 6.

Third Embodiment

Figure 8:
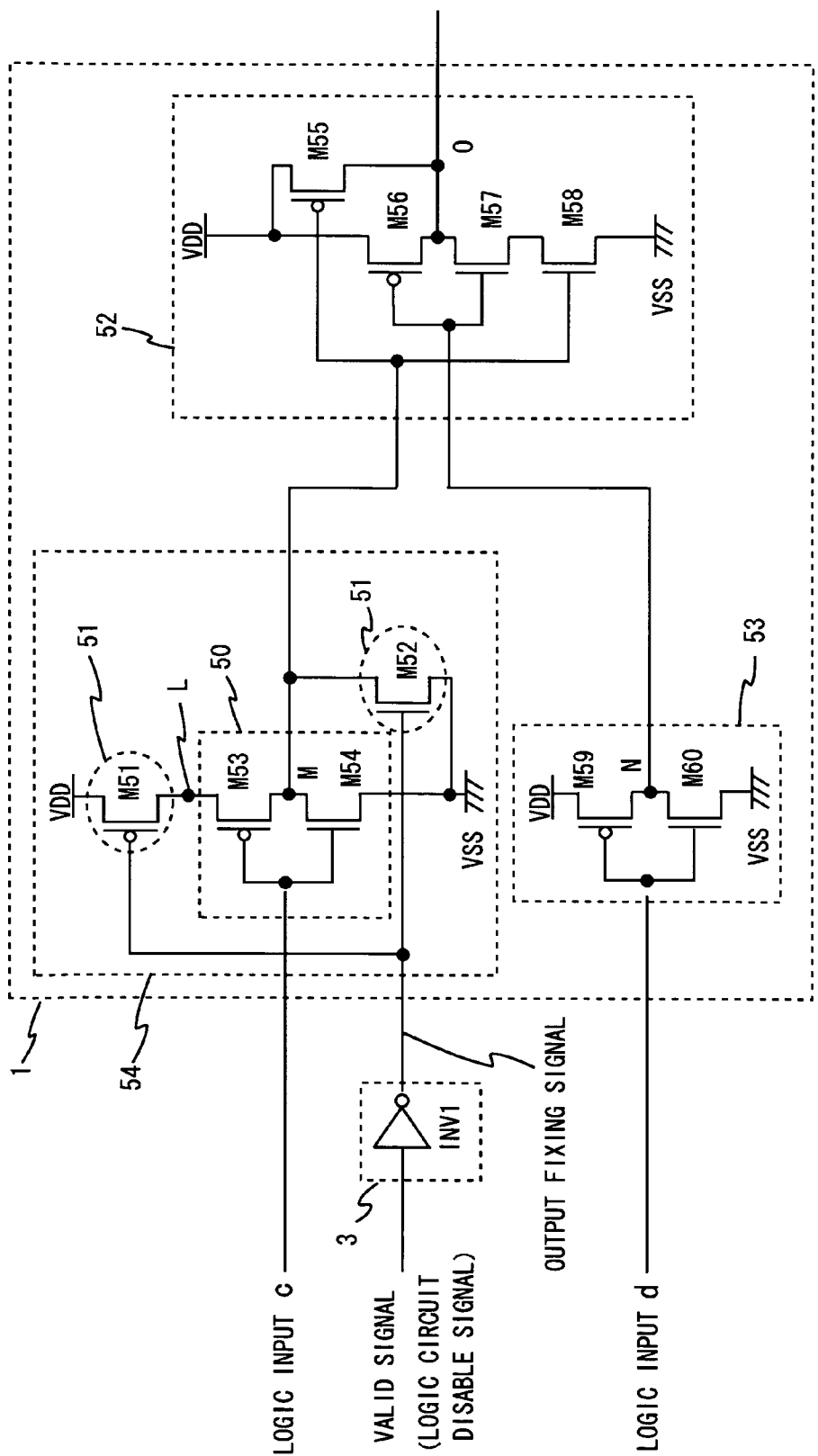
FIG. 8 is one example of a specific configuration of a semiconductor device according to a third embodiment.

Now, a semiconductor device according to the third embodiment of the present invention will be described. A specific configuration of the semiconductor device of the present embodiment shown in FIG. 1 will be described with reference to FIG. 8. FIG. 8 shows one example of a configuration of the semiconductor device according to the third embodiment. Note that the same or similar components as those of FIGS. 1 and 4 are denoted by like reference symbols. In the present embodiment, the output stage circuit of the circuit unit 1 is not an inverter (output buffer) but the logic circuit having two inputs such as NAND and NOR, etc. Further, a part of the transistors generates the high leak current in the present embodiment. Note that only the circuit unit 1 will be described here.

As shown in FIG. 8, the circuit unit 1 includes an input stage circuit 54, an output stage circuit 52, and a logic circuit 53, all of which being configured by the logic circuit or the like having a predetermined function although not specifically limited. The input stage circuit 54 includes a logic circuit 50 having a predetermined function although not specifically limited, and an output fixing circuit 51 connected to the logic circuit 50.

The logic circuit 50 has a following configuration. A drain end of a p-channel MOS transistor M53 and a drain end of an n-channel MOS transistor M54 are connected in a node M. The p-channel MOS transistor M53 and the n-channel MOS transistor M54 have a gate input of a logic input c. A source end of the p-channel MOS transistor M53 is connected to a node L. A source end of the n-channel MOS transistor M54 is connected to the low-potential side power supply VSS. The output fixing circuit 51 includes a p-channel MOS transistor M51 and an n-channel MOS transistor M52. The p-channel MOS transistor M51 and the n-channel MOS transistor M52 have a gate input of the output fixing signal output from the output fixing signal generating circuit 3. In the present embodiment, a source end of the p-channel MOS transistor M51 is connected to the high-potential side power supply VDD, and a drain end of the p-channel MOS transistor M51 is connected to the node L. A source end of the n-channel MOS transistor M52 is connected to the low-potential side power supply VSS, and a drain end of the n-channel MOS transistor M52 is connected to the node M.

The logic circuit 53 has a following configuration. A drain end of a p-channel MOS transistor M59 and a drain end of an n-channel MOS transistor M60 are connected in a node N. The p-channel MOS transistor M59 and the n-channel MOS transistor M60 have a gate input of a logic input d. Further, a source end of the p-channel MOS transistor M59 is connected to the high-potential side power supply VDD. A source end of the n-channel MOS transistor M60 is connected to the low-potential side power supply VSS.

The output stage circuit 52 has a following configuration. A drain end of a p-channel MOS transistor M56 and a drain end of an n-channel MOS transistor M57 are connected in a node O. The p-channel MOS transistor M56 and the n-channel MOS transistor M57 have a gate input of a logic level of the node N. A source end of the p-channel MOS transistor M56 is connected to the high-voltage side power supply VDD. A source end of the p-channel MOS transistor M55 having a gate input of a logic level of a node M is connected to the high-voltage side power supply VDD, and a drain end of the p-channel MOS transistor M55 is connected to the node O. In the same way, a source end of an n-channel MOS transistor M58 having a gate input of a logic level of the node M is connected to the low-potential side power supply VSS, and a drain end of the n-channel MOS transistor M58 is connected to a source end of the n-channel MOS transistor M57. Note that the p-channel MOS transistor M55 has larger leak current in the off state than the n-channel MOS transistor M58.

Now, an operation of the semiconductor device according to the present embodiment will be described. First, we consider a case where the computing unit is in the enable state. In this case, the Valid signal is in the high level, and the output fixing signal output from the output fixing signal generating circuit 3 inverting the Valid signal is in the low level, as described above. The p-channel MOS transistor M51 forming the output fixing circuit 51 is in the on state to connect the high-potential side power supply VDD and the logic circuit 50 (node L). The n-channel MOS transistor M52 forming the output fixing circuit 51 is in the off state, whereby potential of the low-potential side power supply VSS is not supplied to the node M. Accordingly, the logic circuit 50 executes a normal operation where the logic input c is set to be input to output the output result to the output stage circuit 52 (node M). Further, the logic circuit 53 executes a normal operation where the logic input d is set to be input to output the output result to the output stage circuit 52 as well. The output stage circuit 52 executes a normal operation where the outputs of the logic circuit 50 and the logic circuit 53 are set to be inputs to output the output result to the node O as well.

Now, we consider a case where the computing unit is in the disable state. In this case, the Valid signal is in the low level, and the output fixing signal output from the output fixing signal generating circuit 3 inverting the Valid signal is in the high level as described above. In this case, the p-channel MOS transistor M51 forming the output fixing circuit 51 is in the off state to disconnect the high-potential side power supply VDD and the node L or the logic circuit 50. Further, the n-channel MOS transistor M52 forming the output fixing circuit 51 is in the on state, whereby potential of the low-potential side power supply VSS is supplied to the node M. Accordingly, low level logic level is output to the node M. At this time, the p-channel MOS transistor M55 of the output stage circuit 52 having a gate input of the node M is forced to be in the on state and the node O is in the high level. At the same time, the n-channel MOS transistor M58 having a gate input of the node M is forced to be in the off state.

Accordingly, the p-channel MOS transistor M55 which is the transistor generating the high leak current can be held in the on state using the control signal such as the Valid signal output from the instruction decoder when the computing unit is in the disable state. Hence, the pass-through current flows only in the n-channel MOS transistor M58 having relatively small leak current, whereby the leak current of the stage and the semiconductor device can be reduced. The control of the on and off of the transistor generating the high leak current is realized by using the enable signal of the computing unit such as the Valid signal which has conventionally been used without adding the new signal. Note that there is provided an n-channel MOS transistor M57 between the node O and the n-channel MOS transistor M58. However, since the n-channel MOS transistor M58 having the same gate input as the p-channel MOS transistor M55 is provided between the node O and the low-potential side power supply VSS as in the present embodiment, the node O can be held in the high level regardless of the on or off of the n-channel MOS transistor M57.

However, the leak current generated at the n-channel MOS transistor M58 is influenced by the state of on or off of the n-channel MOS transistor M57. For example, when the n-channel MOS transistor M57 is off, the leak current of the n-channel MOS transistor M58 is reduced. Hence, if the pass-through current due to the leak current generated at the output stage circuit 52 is controlled more accurately when the computing unit is in the disable state, the output fixing circuit may be connected also to the logic circuit 53 as well as the logic circuit 50.

The output fixing circuit 51 for fixing the outputs of each logic circuit is connected to the logic circuit 50 having low leak current in the previous step of the final step instead of being connected to the final step of the circuit unit such as the output stage circuit 52 having a transistor generating the high leak current. This is performed at the same time when the output fixing circuit 51 disconnects the power supply to the logic circuit 50 when the computing unit is in the disable state. Accordingly, since the load is relatively small compared with the case where the power supply to the output stage circuit 52 is directly disconnected, it is possible to reduce the influence on the delay due to the increase of the on resistance of the transistor.

It is apparent that the present invention is not limited to the above embodiments, but may be modified and changed without departing from the scope and spirit of the invention. For example, the logic circuit 52 may be an NOR circuit (in this case, the logic output of the input stage circuit needs to be adjusted). Although all the transistors generating the high leak current are controlled to be in the on state by the output fixing circuit in the above embodiments, the control target is not need to be all the transistors generating the high leak current but can be a part of the transistors in accordance with controllability.

What is claimed is:

1. A semiconductor device comprising:
an output stage circuit including a first conductive type first transistor and a second conductive type second transistor, the first conductive type first transistor being connected between a first power supply terminal and an output terminal, the second conductive type second transistor being connected between a second power supply terminal and the output terminal and having a leak current larger than that of the first transistor; and
an input stage circuit outputting a logic value setting the first transistor to a non-conductive state and setting the second transistor to a conductive state in accordance with a logic circuit disable signal input when the output stage circuit is in a disable state, wherein the input stage circuit comprises an output fixing circuit fixing an output of the input stage circuit, wherein the output fixing circuit comprises a third transistor of the first conductive type and a fourth transistor of the second conductive type, gates of the third and fourth transistors connected to each other, wherein the fourth transistor is connected between the second power supply and the input terminal of the output stage converter.

2. The semiconductor device according to claim 1, wherein a leak current flowing in the input stage circuit is smaller than a leak current of the second transistor.

3. The semiconductor device according to claim 1, wherein the output fixing circuit fixes an output of the input stage circuit in accordance with a logic circuit disable signal input when the output stage circuit is in a disable state.

4. The semiconductor device according to claim 1, wherein an output side of the output stage circuit has a large line length.

5. The semiconductor device according to claim 1, wherein an output side of the output stage circuit has a greater number of fan outs.

6. The semiconductor device according to claim 1, wherein the output stage circuit and the input stage circuit form a pipeline stage processing part in a microcomputer.

7. The semiconductor device according to claim 6, wherein the logic circuit disable signal switches the pipeline stage processing part in the microcomputer to a disable state according to the logic value.

8. The semiconductor device according to claim 4, wherein the line length is greater than or equal to 200 μm.

* * * * *